United States Patent
Masuda et al.

(10) Patent No.: US 9,184,276 B2
(45) Date of Patent: Nov. 10, 2015

(54) METHOD AND APPARATUS FOR MANUFACTURING SILICON CARBIDE SEMICONDUCTOR DEVICE

(75) Inventors: Takeyoshi Masuda, Osaka (JP); Keiji Wada, Osaka (JP); Satomi Itoh, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 224 days.

(21) Appl. No.: 13/502,976

(22) PCT Filed: Feb. 25, 2011

(86) PCT No.: PCT/JP2011/054332
§ 371 (c)(1),
(2), (4) Date: Apr. 19, 2012

(87) PCT Pub. No.: WO2011/158533
PCT Pub. Date: Dec. 22, 2011

(65) Prior Publication Data
US 2012/0208368 A1    Aug. 16, 2012

(30) Foreign Application Priority Data
Jun. 16, 2010   (JP) ................................. 2010-136870

(51) Int. Cl.
*H01L 21/311*   (2006.01)
*H01L 29/78*    (2006.01)
(Continued)

(52) U.S. Cl.
CPC ...... *H01L 29/7802* (2013.01); *H01L 21/02057* (2013.01); *H01L 21/02236* (2013.01); *H01L 21/02301* (2013.01); *H01L 21/049* (2013.01); *H01L 21/0445* (2013.01);
(Continued)

(58) Field of Classification Search
CPC ..................... H01L 21/0445; H01L 29/66053
USPC ............ 257/77, E21.054, E21.065, E21.066; 438/105, 703
See application file for complete search history.

(56) References Cited

U.S. PATENT DOCUMENTS 5,272,107 A    12/1993  Suzuki et al.
5,786,277 A *  7/1998   Yamamoto .................... 438/770
(Continued)

FOREIGN PATENT DOCUMENTS

CN       101263586 A    9/2008
EP       1 895 573 A1   3/2008
(Continued)

OTHER PUBLICATIONS

Decision to Grant Patent issued in Japanese Patent Application No. 2010-136870 dated Jul. 29, 2014.
(Continued)

*Primary Examiner* — Robert Huber
(74) *Attorney, Agent, or Firm* — Venable LLP; Michael A. Sartori; Tamatane J. Aga (57) ABSTRACT

A method of manufacturing an SiC semiconductor device includes the steps of forming a first oxide film on a first surface of an SiC semiconductor, removing the first oxide film, and forming a second oxide film constituting the SiC semiconductor device on a second surface exposed as a result of removal of the first oxide film in the SiC semiconductor. Between the step of removing the first oxide film and the step of forming a second oxide film, the SiC semiconductor is arranged in an atmosphere cut off from an ambient atmosphere.

11 Claims, 5 Drawing Sheets

(51) Int. Cl.
*H01L 21/04* (2006.01)
*H01L 29/66* (2006.01)
*H01L 21/02* (2006.01)
*H01L 29/16* (2006.01)

(52) U.S. Cl.
CPC ... *H01L 29/66053* (2013.01); *H01L 29/66068* (2013.01); *H01L 29/1608* (2013.01)

(56) References Cited

U.S. PATENT DOCUMENTS

| | | | |
|---|---|---|---|
| 6,136,727 | A | 10/2000 | Ueno |
| 6,214,107 | B1 * | 4/2001 | Kitabatake ............ 117/95 |
| 6,297,172 | B1 | 10/2001 | Kashiwagi |
| 2002/0052102 | A1 | 5/2002 | Kiritani |
| 2008/0318438 | A1 | 12/2008 | Nakamura et al. |
| 2009/0227098 | A1 | 9/2009 | Matsuyama |

FOREIGN PATENT DOCUMENTS

| | | | |
|---|---|---|---|
| JP | 60-066866 A | | 4/1985 |
| JP | 6-314679 A | | 11/1994 |
| JP | 09-052796 A | | 2/1997 |
| JP | 11-186256 A | | 7/1999 |
| JP | 2000049167 A | * | 2/2000 |
| JP | 2000-349081 A | | 12/2000 |
| JP | 2002-075908 A | | 3/2002 |
| JP | 2002-075984 A | | 3/2002 |
| JP | 2002-093800 A | | 3/2002 |
| JP | 2006-251744 A | | 9/2006 |
| JP | 2006-321707 A | | 11/2006 |
| JP | 2007-053227 A | | 3/2007 |
| JP | 2008-098200 A | | 4/2008 |
| JP | 2009-064955 A | | 3/2009 |
| WO | WO-2007/040709 A1 | | 4/2007 |

OTHER PUBLICATIONS

Werkhoven et al., "Wet and dry HF-last cleaning process for high-integrity gate oxides," Electron Devices Meeting, Dec. 13, 1992, 633-636.

Djemia et al., "Elastic properties of β-SiC films by Brillouin light scattering," Journal of Applied Physics, vol. 95, No. 5, Mar. 1, 2014, pp. 2324-2330.

Shenoy et al., "Characterization and optimization of the $SiO_2$/SiC metal-oxide-semiconductor interface," Journal of Electronic Materials, vol. 24, No. 4, Apr. 1, 1995, pp. 303-309.

Ueno et al., "$H_2$ surface treatment for gate-oxidation of SiC metal-oxide-semiconductor field effect transistors," Materials Science and Engineering B, vol. 61-62, Jul. 30, 1999, pp. 472-474.

Deal et al., "Vapor phase wafer cleaning: processing for the 1990s," Solid State Technology, vol. 33, No. 7, Jul. 1, 1990, pp. 73-77.

Extended European Search Report issued in European Patent Application No. 11795441.2 dated Nov. 12, 2014.

Notification of First Office Action issued in Chinese Patent Application No. 201180004388.7 dated Dec. 1, 2014.

\* cited by examiner

METHOD AND APPARATUS FOR MANUFACTURING SILICON CARBIDE SEMICONDUCTOR DEVICE

TECHNICAL FIELD

The present invention relates to a method and an apparatus for manufacturing a silicon carbide (SiC) semiconductor device, and more particularly to a method and an apparatus for manufacturing an SiC semiconductor device having an oxide film.

BACKGROUND ART

In a method of manufacturing a semiconductor device, in order to remove deposits adhering to a surface, cleaning has conventionally been performed. For example, a technique disclosed in Japanese Patent Laying-Open No. 6-314679 (PTL 1) is exemplified as such a cleaning method. The method of cleaning a semiconductor substrate in PTL 1 is performed in the following manner. Initially, a silicon (Si) substrate is cleaned with ultrapure water containing ozone to thereby form an Si oxide film, so that particles and a metal impurity are taken into the inside or into a surface of this Si oxide film. Then, this Si substrate is cleaned with a diluted hydrofluoric acid aqueous solution so that the Si oxide film is etched away and simultaneously the particles and the metal impurity are removed.

CITATION LIST

Patent Literature

PTL 1: Japanese Patent Laying-Open No. 6-314679

SUMMARY OF INVENTION

Technical Problem

The present inventor revealed for the first time that use of the cleaning method disclosed in PTL 1 above for manufacturing an SiC semiconductor device gives rise to the following problem. In manufacturing, for example, a MOSFET (Metal Oxide Semiconductor Field Effect Transistor) as an SiC semiconductor device, for example, an SiC epitaxial layer is formed on an SiC substrate, a surface of this epitaxial layer is cleaned, and a gate oxide film is formed on this surface. Even if the surface of the epitaxial layer is cleaned with the cleaning method in PTL 1 above, an impurity will be deposited on the cleaned surface. When a gate oxide film is formed on this surface, presence of an impurity at an interface between the epitaxial layer and the gate oxide film leads to poor characteristics of the SiC semiconductor device.

Therefore, an object of the present invention is to provide a method and an apparatus for manufacturing an SiC semiconductor device capable of achieving improved characteristics.

Solution to Problem

As a result of dedicated studies conducted by the present inventor, the present inventor has found that the problem above is caused by arrangement of a cleaned epitaxial layer in an ambient atmosphere or in an atmosphere low in cleanliness.

Then, a method of manufacturing an SiC semiconductor device according to the present invention includes the steps of forming a first oxide film on a first surface of an SiC semiconductor, removing the first oxide film, and forming a second oxide film constituting the SiC semiconductor device on a second surface exposed as a result of removal of the first oxide film in the SiC semiconductor, and between the step of removing the first oxide film and the step of forming a second oxide film, the SiC semiconductor is arranged in an atmosphere cut off from an ambient atmosphere.

According to the method of manufacturing an SiC semiconductor device in the present invention, in the step of forming a first oxide film, an impurity, particles and the like deposited on the first surface of the SiC semiconductor can be taken into the first oxide film. Through the step of removing the first oxide film, the impurity, the particles and the like deposited on the first surface of the SiC semiconductor are removed so as to be able to form a cleaned second surface. By arranging the SiC semiconductor from which the impurity, the particles and the like have been removed in an atmosphere cut off from the ambient atmosphere, re-deposition of an impurity, particles and the like in the ambient atmosphere onto the second surface of the SiC semiconductor can be suppressed and hence the second surface of the SiC semiconductor can be maintained clean. In the step of forming a second oxide film, since a second oxide film constituting an SiC semiconductor device can be formed on the second surface of the SiC semiconductor maintained clean, an impurity, particles and the like present at an interface between the second surface of the SiC semiconductor and the second oxide film can be decreased. Therefore, an SiC semiconductor device capable of achieving improved characteristics can be manufactured.

In the method of manufacturing an SiC semiconductor device above, preferably, between the step of forming a first oxide film and the step of removing the first oxide film, the SiC semiconductor is arranged in an atmosphere cut off from the ambient atmosphere.

Thus, not only after removal of the first oxide film but also after formation of the first oxide film, re-deposition of an impurity, particles and the like can be suppressed. Therefore, an impurity, particles and the like present at an interface between the SiC semiconductor and the second oxide film can further be decreased. Therefore, an SiC semiconductor device capable of achieving further improved characteristics can be manufactured.

In the method of manufacturing an SiC semiconductor device above, preferably, in the step of forming a first oxide film, a damaged layer formed on the first surface of the SiC semiconductor is oxidized.

By thus performing the step of removing the first oxide film, a damaged layer formed on the first surface of the SiC semiconductor can also be removed. Since the characteristics of the SiC semiconductor can thus be improved, the SiC semiconductor capable of achieving further improved characteristics can be manufactured.

In the method of manufacturing an SiC semiconductor device above, preferably, the step of removing the first oxide film includes at least one of the step of thermally decomposing the first oxide film at a temperature not lower than 1200° C. and not higher than a temperature of sublimation of SiC in an atmosphere not containing oxygen (O) and the step of etching using a gas including at least one selected from the group consisting of a hydrogen gas ($H_2$), a hydrogen chloride gas (HCl), a sulfur fluoride gas ($SF_6$), and a carbon fluoride gas ($CF_4$) at a temperature not lower than 1000° C. and not higher than the temperature of sublimation of SiC.

Thus, since the first oxide film can readily be removed without wet cleaning (cleaning including a liquid phase), contamination by wet cleaning can be prevented. In the method of manufacturing an SiC semiconductor device above, preferably, between the step of removing the first oxide film and the step of forming a second oxide film, a temperature difference in the SiC semiconductor by 500° C. or less is held.

By suppressing lowering in temperature between the step of removing the first oxide film and the step of forming a second oxide film, a time period for temperature increase can be reduced and hence throughput can be improved.

In the method of manufacturing an SiC semiconductor device above, preferably, in the step of forming a second oxide film, the second oxide film is formed by using an apparatus used in the step of removing the first oxide film.

Since the first oxide film can be removed and a second oxide film can be formed with the use of the same apparatus, temperature lowering between the step of removing the first oxide film and the step of forming a second oxide film can be suppressed. Thus, since a time period for temperature increase required in transition between the step of removing the first oxide film and the step of forming a second oxide film can be reduced, throughput can be improved.

In the method of manufacturing an SiC semiconductor device above, preferably, between the steps of forming a first oxide film, removing the first oxide film, and forming a second oxide film, a temperature difference in the SiC semiconductor by 500° C. or less is held.

Thus, since temperature lowering between the steps of forming a first oxide film, removing the first oxide film, and forming a second oxide film can be suppressed, throughput can further be improved.

In the method of manufacturing an SiC semiconductor device above, preferably, an apparatus used in the step of forming a first oxide film, an apparatus used in the step of removing the first oxide film, and an apparatus used in the step of forming a second oxide film are common.

Since the first oxide film can be formed, the first oxide film can be removed, and the second oxide film can be formed with the use of the same apparatus, temperature lowering due to transition between the steps of forming the first oxide film, removing the first oxide film, and forming a second oxide film can be suppressed. Therefore, throughput can further be improved.

An apparatus for manufacturing an SiC semiconductor device in one aspect of the present invention includes a first forming portion, a removal portion, a second forming portion, and a first connection portion. The first forming portion forms a first oxide film on a first surface of an SiC semiconductor. The removal portion removes the first oxide film. The second forming portion forms a second oxide film constituting the SiC semiconductor device on a second surface exposed as a result of removal of the first oxide film in the SiC semiconductor. The first connection portion connects the removal portion and the second forming portion to each other so as to be able to carry the SiC semiconductor. A region in the first connection portion in which the SiC semiconductor is carried can be cut off from an ambient atmosphere.

According to the apparatus for manufacturing an SiC semiconductor in one aspect of the present invention, in the first forming portion, a first oxide film can be formed such that an impurity, particles and the like deposited on the first surface of the SiC semiconductor are taken therein. By removing the first oxide film in the removal portion, a second surface cleaned by removing the impurity, the particles and the like deposited on the first surface of the SiC semiconductor can be formed. Owing to the first connection portion, since the SiC semiconductor having the second surface from which the impurity, the particles and the like have been removed can be arranged in an atmosphere cut off from the ambient atmosphere, re-deposition of an impurity, particles and the like in the ambient atmosphere onto the second surface of the SiC semiconductor can be suppressed, and hence the second surface of the SiC semiconductor can be maintained clean. In the second forming portion, since the second oxide film constituting an SiC semiconductor device can be formed on the second surface of the SiC semiconductor maintained clean, an impurity, particles and the like present at an interface between the second surface of the SiC semiconductor and the second oxide film can be decreased. Therefore, an SiC semiconductor device capable of achieving improved characteristics can be manufactured.

The apparatus for manufacturing an SiC semiconductor in one aspect above preferably further includes a second connection portion connecting the first forming portion and the removal portion to each other so as to be able to carry the SiC semiconductor, and a region in the second connection portion in which the SiC semiconductor is carried can be cut off from the ambient atmosphere.

Thus, owing to the second connection portion, after the first oxide film is formed and the first oxide film is removed, re-deposition of an impurity, particles and the like can be suppressed. Therefore, an impurity, particles and the like present at an interface between the SiC semiconductor and the second oxide film can further be decreased. Therefore, an SiC semiconductor device capable of achieving further improved characteristics can be manufactured.

An apparatus for manufacturing an SiC semiconductor device in another aspect of the present invention includes a first forming portion and a second forming portion. The first forming portion forms a first oxide film on a first surface of an SiC semiconductor. The second forming portion removes the first oxide film and forms a second oxide film constituting the SiC semiconductor device on a second surface exposed as a result of removal of the first oxide film in the SiC semiconductor.

According to the apparatus for manufacturing an SiC semiconductor in another aspect of the present invention, in the first forming portion, a first oxide film can be formed such that an impurity, particles and the like deposited on the first surface of the SiC semiconductor are taken therein. By removing the first oxide film in the second forming portion, a second surface cleaned by removing the impurity, the particles and the like deposited on the first surface of the SiC semiconductor can be formed. Since a second oxide film constituting an SiC semiconductor device can be formed in the same second forming portion, during a period from removal of the first oxide film until formation of the second oxide film, the SiC semiconductor having the second surface from which the impurity, the particles and the like have been removed can be arranged in an atmosphere cut off from the ambient atmosphere. Thus, re-deposition of an impurity, particles and the like in the ambient atmosphere onto the second surface of the SiC semiconductor can be suppressed and a second oxide film constituting the SiC semiconductor device can be formed with the second surface of the SiC semiconductor being maintained clean. Therefore, an impurity, particles and the like present at an interface between the second surface of the SiC semiconductor and the second oxide film can be decreased. Therefore, an SiC semiconductor device capable of achieving improved characteristics can be manufactured.

In the apparatus for manufacturing an SiC semiconductor device in another aspect above, preferably, the first forming portion and the second forming portion are common.

Thus, after the first oxide film is formed and the first oxide film is removed, re-deposition of an impurity, particles and the like can be suppressed. Thus, an impurity, particles and the like present at an interface between the SiC semiconductor and the second oxide film can further be decreased. Therefore, an SiC semiconductor device capable of achieving further improved characteristics can be manufactured.

Advantageous Effects of Invention

As described above, according to the method and the apparatus for manufacturing an SiC semiconductor device in the present invention, since the cleaned SiC semiconductor is arranged in an atmosphere cut off from the ambient atmosphere, an impurity, particles and the like present at an interface between the SiC semiconductor and the oxide film constituting the SiC semiconductor device can be decreased. Therefore, an SiC semiconductor achieving improved characteristics can be manufactured.

DESCRIPTION OF EMBODIMENTS

An embodiment of the present invention will be described hereinafter with reference to the drawings. In the drawings below, the same or corresponding elements have the same reference characters allotted and description thereof will not be repeated.

(First Embodiment)

Figure 1:
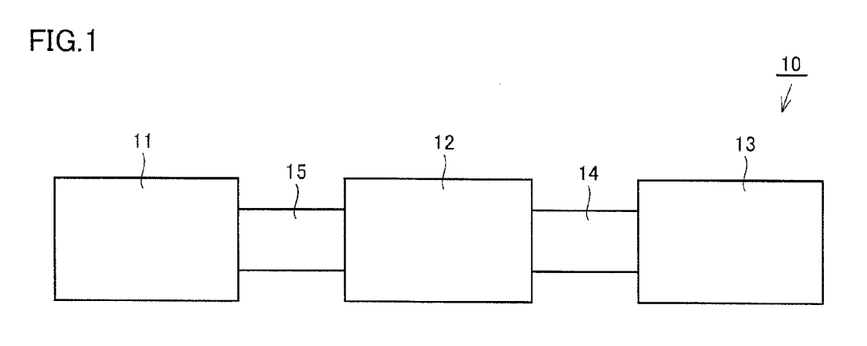
FIG. 1 is a schematic diagram showing an apparatus for manufacturing an SiC semiconductor device in a first embodiment of the present invention.

FIG. 1 is a schematic diagram showing an apparatus for manufacturing an SiC semiconductor device in a first embodiment of the present invention. An SiC semiconductor device manufacturing apparatus 10 in one embodiment of the present invention will be described with reference to FIG. 1.

As shown in FIG. 1, SiC semiconductor device manufacturing apparatus 10 includes a first forming portion 11, a removal portion 12, a second forming portion 13, a first connection portion 14, and a second connection portion 15. Removal portion 12 and second forming portion 13 are connected to each other through first connection portion 14. First forming portion 11 and removal portion 12 are connected to each other through second connection portion 15. The insides of removal portion 12, second forming portion 13, and first connection portion 14 are cut off from the ambient atmosphere, and the insides can communicate with one another. The insides of first forming portion 11, removal portion 12, and second connection portion 15 are cut off from the ambient atmosphere, and the insides can communicate with one another.

First forming portion 11 forms a first oxide film on a first surface of an SiC semiconductor. For example, a thermal oxidation apparatus, a plasma generation apparatus, an apparatus for forming a first oxide film using a solution containing oxygen such as ozone water, or the like is employed as first forming portion 11.

Removal portion 12 removes the first oxide film formed in first forming portion 11. For example, a thermal decomposition apparatus, an etching apparatus using a gas, a plasma generation apparatus, an apparatus for removing the first oxide film using a solution of hydrogen fluoride (HF), or the like is employed as removal portion 12.

The plasma generation apparatus employed for first forming portion 11 and removal portion 12 is not particularly limited, and for example, a parallel plate RIE (Reactive Ion Etching) apparatus, an ICP (Inductive Coupled Plasma) RIE apparatus, an ECR (Electron Cyclotron Resonance) RIE apparatus, an SWP (Surface Wave Plasma) RIE apparatus, and the like are employed.

Second forming portion 13 forms a second oxide film constituting an SiC semiconductor device (see FIG. 9) on a second surface exposed as a result of removal of the first oxide film in the SiC semiconductor by removal portion 12. For example, a thermal oxidation apparatus, a CVD (Chemical Vapor Deposition) apparatus, or the like is employed as second forming portion 13.

First connection portion 14 connects removal portion 12 and second forming portion 13 to each other so as to be able to carry an SiC semiconductor therein. Second connection portion 15 connects first forming portion 11 and removal portion 12 to each other so as to be able to carry the SiC semiconductor therein. A region in first and second connection portions 14, 15 for carrying an SiC semiconductor (an internal space) can be cut off from the ambient atmosphere.

Here, being cut off from the ambient atmosphere (an atmosphere cut off from the ambient atmosphere) refers to an atmosphere in which the ambient atmosphere is not introduced, and refers, for example, to an atmosphere in which vacuum is produced or which contains an inert gas or a nitrogen gas. Specifically, an atmosphere cut off from the ambient atmosphere refers, for example, to an atmosphere filled with nitrogen (N), helium (He), neon (Ne), argon (Ar), krypton (Kr), xenon (Xe), radon (Rn), or a gas which is combination thereof. In addition, an atmosphere cut off from the ambient atmosphere is set, for example, to 1 Pa or lower and preferably to 0.1 Pa or lower.

In the present embodiment, first connection portion 14 couples the inside of removal portion 12 and the inside of second forming portion 13 to each other. First connection portion 14 has a space for carrying an SiC semiconductor loaded out of removal portion 12 to second forming portion 13 in the inside. Namely, first connection portion 14 is provided in order to carry an SiC semiconductor from removal portion 12 to second forming portion 13 without exposing the SiC semiconductor to the ambient atmosphere.

Similarly, second connection portion 15 couples the inside of first forming portion 11 and the inside of removal portion 12 to each other. Second connection portion 15 has a space for carrying an SiC semiconductor loaded out of first forming portion 11 to removal portion 12 in the inside. Namely, second connection portion 15 is provided in order to carry an SiC semiconductor from first forming portion 11 to removal portion 12 without exposing the SiC semiconductor to the ambient atmosphere. It is not necessary to provide second connection portion 15.

First and second connection portions 14, 15 have such a size that the SiC semiconductor can be carried therein. Alternatively, first and second connection portions 14, 15 may also have such a size that an SiC semiconductor as placed on a susceptor can be carried therein. First connection portion 14 is implemented, for example, by a load lock chamber connecting an exit of removal portion 12 and an entrance of second forming portion 13 to each other. Second connection portion 15 is implemented, for example, by a load lock chamber coupling an exit of first forming portion 11 and an entrance of removal portion 12 to each other.

Manufacturing apparatus 10 may further include a first carrier portion arranged in first connection portion 14, for carrying an SiC semiconductor from removal portion 12 to second forming portion 13. Similarly, manufacturing apparatus 10 may further include a second carrier portion arranged in second connection portion 15, for carrying the SiC semiconductor from first forming portion 11 to removal portion 12. The first carrier portion and the second carrier portion may be identical to or different from each other.

Manufacturing apparatus 10 may further include a heat insulating member covering first and second connection portions 14, 15. Manufacturing apparatus 10 may further include a heating portion arranged around first and second connection portions 14, 15, for heating first and second connection portions 14, 15. In this case, since a temperature difference between first forming portion 11, removal portion 12, and second forming portion 13 can be decreased, temperature lowering in the SiC semiconductor due to carrying can be suppressed.

Manufacturing apparatus 10 may further include a first cut-off portion arranged in first connection portion 14, for cutting off the inside of removal portion 12 and the inside of second forming portion 13 from each other. Manufacturing apparatus 10 may further include a second cut-off portion arranged in second connection portion 15, for cutting off the inside of first forming portion 11 and the inside of removal portion 12 from each other. The first and second cut-off portions can include, for example, a valve, a door or the like capable of closing each communicating portion, and a plurality of cut-off portions may be provided.

Manufacturing apparatus 10 may further include a vacuum pump for exhausting an atmospheric gas in the inside or a replacement gas canister for replacing an atmospheric gas in the inside. The vacuum pump or the replacement gas canister may be connected to each of first forming portion 11, removal portion 12, second forming portion 13, first connection portion 14, and second connection portion 15, or to at least any one of them.

Though manufacturing apparatus 10 may include various elements other than the above, for the sake of convenience of description, illustration and description of these elements will not be provided.

Though FIG. 1 shows a form in which first connection portion 14 couples only removal portion 12 and second forming portion 13 to each other and second connection portion 15 couples only first forming portion 11 and removal portion 12 to each other, they are not particularly limited as such. For example, a chamber cut off from the ambient atmosphere may be employed as first and second connection portions 14, 15 and first forming portion 11, removal portion 12, and second forming portion 13 may be arranged in this chamber.

Figure 2:
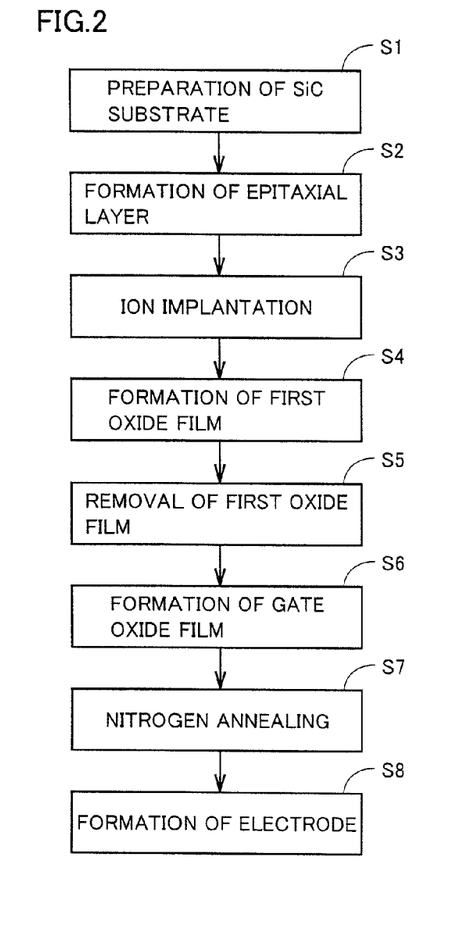
FIG. 2 is a flowchart showing a method of manufacturing an SiC semiconductor device in the first embodiment of the present invention.

FIG. 2 is a flowchart showing a method of manufacturing an SiC semiconductor device in the first embodiment of the present invention. FIGS. 3 to 10 are each a cross-sectional view schematically showing each step of manufacturing an SiC semiconductor device in the first embodiment of the present invention. In succession, a method of manufacturing an SiC semiconductor device in one embodiment of the present invention will be described with reference to FIGS. 1 to 10. In the present embodiment, a MOSFET (Metal Oxide Semiconductor Field Effect Transistor) is manufactured by way of example of an SiC semiconductor device, with the use of SiC semiconductor manufacturing apparatus 10 shown in FIG. 1.

Figure 3:
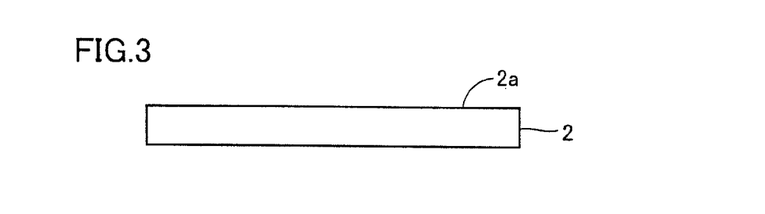
FIG. 3 is a cross-sectional view schematically showing each step of manufacturing an SiC semiconductor device in the first embodiment of the present invention.

As shown in FIGS. 2 and 3, initially, an SiC substrate 2 having a surface 2a is prepared (step S1). Though SiC substrate 2 is not particularly limited, for example, it can be prepared with the following method.

Specifically, an SiC ingot grown, for example, with a vapor phase epitaxy method such as a sublimation method, a CVD method, an HVPE (Hydride Vapor Phase Epitaxy) method, an MBE (Molecular Beam Epitaxy) method, and an OMVPE (OrganoMetallic Vapor Phase Epitaxy) method, and a liquid phase epitaxy method such as a flux method and a high nitrogen pressure solution method, is prepared. Thereafter, an SiC substrate having a surface is cut from the SiC ingot. A cutting method is not particularly limited and the SiC substrate is cut from the SiC ingot by slicing or the like.

Then, the surface of the cut SiC substrate is polished. The surface to be polished may be only a front surface, or a back surface opposite to the front surface may further be polished. A polishing method is not particularly limited, and for example, CMP (Chemical Mechanical Polishing) can be adopted in order to planarize the surface and to lessen such damages as flaws. In CMP, colloidal silica is employed as an abrasive, diamond or chromium oxide is employed as abrasive grains, and an adhesive, a wax or the like is employed as an fixing agent. In addition to or instead of CMP, other polishing such as an electropolishing method, a chemical polishing method, a mechanical polishing method, and the like may further be performed. Alternatively, polishing may not be performed.

Thereafter, a surface of the SiC substrate is cleaned. A cleaning method is not particularly limited, and for example, cleaning by forming an oxide film by thermal oxidation or the like and thereafter removing the oxide film through thermal decomposition, thermal etching, or the like can be adopted. It is noted that cleaning does not have to be performed.

Thus, SiC substrate 2 having surface 2a shown in FIG. 3 can be prepared. For example, a substrate having an n conductivity type and resistance of 0.02 Ωcm is employed as such SiC substrate 2.

Figure 4:
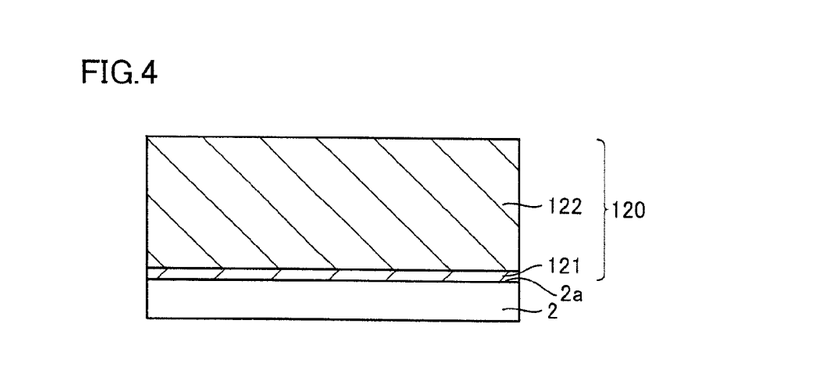
FIG. 4 is a cross-sectional view schematically showing each step of manufacturing an SiC semiconductor device in the first embodiment of the present invention.

Then, as shown in FIGS. 2 and 4, an epitaxial layer 120 is formed on surface 2a of SiC substrate 2 with a vapor phase epitaxy method, a liquid phase epitaxy method, or the like (step S2). In the present embodiment, for example, epitaxial layer 120 is formed as follows.

Specifically, as shown in FIG. 4, a buffer layer 121 is formed on surface 2a of SiC substrate 2. Buffer layer 121 is an epitaxial layer composed, for example, of SiC having an n conductivity type and a thickness, for example, of 0.5 μm. In addition, concentration of a conductive impurity in buffer layer 121 is, for example, $5 \times 10^{17}$ cm$^{-3}$.

Thereafter, as shown in FIG. 4, a breakdown voltage holding layer 122 is formed on buffer layer 121. As breakdown voltage holding layer 122, a layer composed of SiC having an n conductivity type is formed with a vapor phase epitaxy method, a liquid phase epitaxy method, or the like. Breakdown voltage holding layer 122 has a thickness, for example, of 15 μm. In addition, concentration of an n-type conductive impurity in breakdown voltage holding layer 122 is, for example, $5 \times 10^{15}$ cm$^{-3}$.

Figure 5:
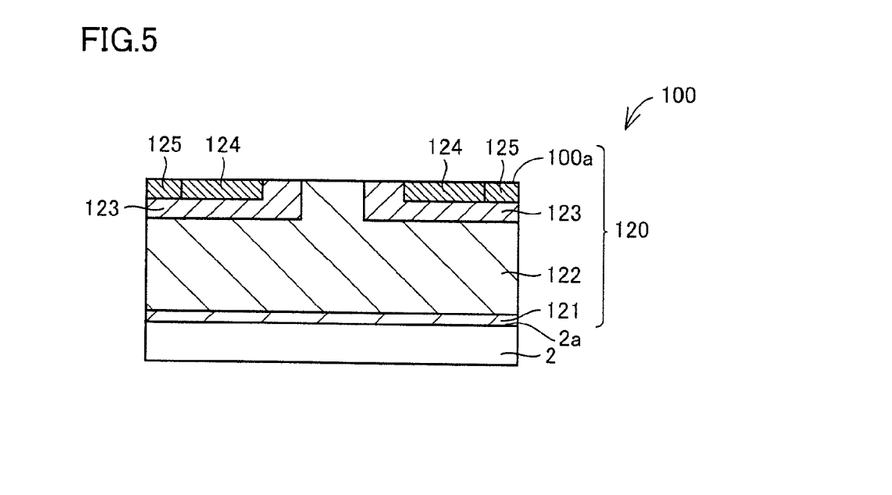
FIG. 5 is a cross-sectional view schematically showing each step of manufacturing an SiC semiconductor device in the first embodiment of the present invention.

Then, as shown in FIGS. 2 and 5, ions are implanted into epitaxial layer 120 (step S3). In the present embodiment, as shown in FIG. 5, a p-type well region 123, an n$^+$ source region 124, and a p$^+$ contact region 125 are formed as follows. Initially, well region 123 is formed by selectively implanting an impurity having a p conductivity type into a part of breakdown voltage holding layer 122. Thereafter, source region 124 is formed by selectively implanting an n-type conductive impurity into a prescribed region, and contact region 125 is formed by selectively implanting a conductive impurity having a p conductivity type into a prescribed region. It is noted that selective implantation of an impurity is carried out, for example, by using a mask formed from an oxide film. This mask is removed after an impurity is implanted.

After such an ion implantation step S3, an activation annealing treatment may be performed. For example, in an argon atmosphere, annealing for 30 minutes at a heating temperature of 1700° C. is carried out.

Alternatively, after ion implantation step S3, surface cleaning such as organic solvent cleaning, acid cleaning, RCA cleaning, or the like may further be performed.

Through these steps, as shown in FIG. 5, an epitaxial wafer 100 including SiC substrate 2 and epitaxial layer 120 formed on SiC substrate 2 can be prepared.

Figure 6:
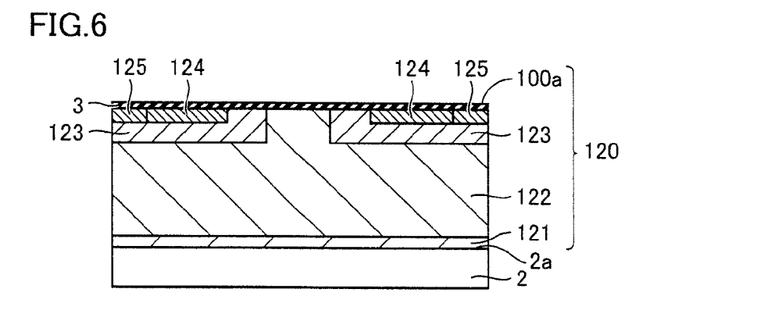
FIG. 6 is a cross-sectional view schematically showing each step of manufacturing an SiC semiconductor device in the first embodiment of the present invention.

Then, a surface 100a (a first surface) of epitaxial wafer 100 (the SiC semiconductor) is cleaned. Specifically, as shown in FIGS. 2 and 6, a first oxide film 3 is formed on surface 100a of epitaxial wafer 100 (step S4). First oxide film 3 is composed, for example, of silicon oxide. In step S4 in the present embodiment, first oxide film 3 is formed in first forming portion 11 of manufacturing apparatus 10 shown in FIG. 1.

A method of forming first oxide film 3 is not particularly limited, and for example, a method of oxidizing surface 100a of epitaxial wafer 100 by using a solution containing O, thermal oxidation in an atmosphere containing O plasma or an O gas, or the like is employed.

A solution containing O refers to a solution containing oxygen, and ozone water is exemplified. In consideration of the fact that SiC is a stable compound, for example, ozone water having concentration not lower than 30 ppm is preferably used. In this case, decomposition of ozone can be suppressed and a reaction speed between surface 100a of epitaxial wafer 100 and ozone can be increased, and hence first oxide film 3 can readily be formed on surface 100a.

An O gas refers to a gas containing oxygen, and thermal oxidation containing an O gas is preferably carried out in a dry atmosphere, for example, at a temperature not lower than 700° C., in consideration of the fact that SiC is a stable compound. It is noted that the dry atmosphere means formation of first oxide film 3 in a vapor phase and it may contain an unintended liquid phase component.

O plasma refers to plasma generated from a gas containing oxygen and it can be generated, for example, by supplying an oxygen gas (O$_2$) to the plasma generation apparatus. "Forming first oxide film 3 with O plasma" means that first oxide film 3 is formed with plasma using a gas containing oxygen. In other words, it means formation of first oxide film 3 by treatment with plasma generated from a gas containing oxygen.

In a case where removal of an impurity and particles deposited on surface 100a is aimed in this step S4, for example, first oxide film 3 having a thickness not smaller than one molecular layer and not greater than 10 nm (a thickness in a direction from surface 100a to SiC substrate 2) is formed. By forming first oxide film 3 having a thickness not smaller than one molecular layer, an impurity, particles and the like deposited on surface 100a can be taken into the surface or the inside of first oxide film 3. By forming an oxide film not greater than 10 nm, removal of first oxide film 3 in step S5 which will be described later is facilitated. In taking in an impurity and particles on surface 100a followed by oxidation, cleaning in a liquid phase (wet cleaning) and cleaning in a vapor phase (dry cleaning) can be employed.

If damage is caused in surface 100a by ion implantation into epitaxial wafer 100, activation annealing treatment thereof or the like and removal of a damaged layer formed on surface 100a of epitaxial wafer 100 is aimed, the damaged layer is oxidized in this step S4. In this case, for example, first oxide film 3 having a thickness exceeding 10 nm and not greater than 100 nm is formed. By oxidizing the damaged layer, an impurity, particles and the like deposited on surface 100a can also be taken into first oxide film 3. In oxidizing the damaged layer, cleaning in a vapor phase (dry cleaning) is adopted. Here, since the damaged layer suffers from surface roughening as compared with other regions, it can be specified based on presence of excessive silicon or carbon (C) as compared with a non-implanted region, for example, by conducting SIMS analysis.

Referring next to FIG. 1, epitaxial wafer 100 on which first oxide film 3 has been formed in first foaming portion 11 is carried to removal portion 12. Here, epitaxial wafer 100 is carried through second connection portion 15 having an atmosphere cut off from the ambient atmosphere. In other words, between step S4 of forming first oxide film 3 and step S5 of removing first oxide film 3, epitaxial wafer 100 is arranged in an atmosphere cut off from the ambient atmosphere. Thus, after first oxide film 3 is formed, deposition of an impurity contained in the ambient atmosphere onto a surface 100a of epitaxial wafer 100 can be suppressed.

Figure 7:
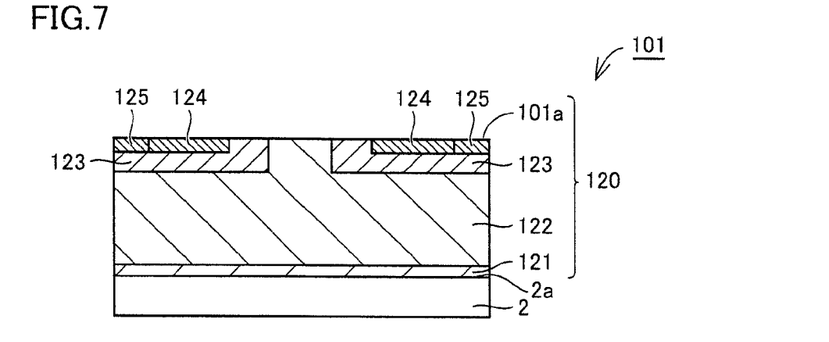
FIG. 7 is a cross-sectional view schematically showing each step of manufacturing an SiC semiconductor device in the first embodiment of the present invention.

Then, as shown in FIGS. 2 and 7, first oxide film 3 is removed (step S5). In step S5 in the present embodiment, first oxide film 3 is removed in removal portion 12 of manufacturing apparatus 10 shown in FIG. 1.

A method of removing first oxide film 3 is not particularly limited, and for example, wet etching, dry etching, thermal decomposition, F plasma, or the like can be employed.

In wet etching, for example, first oxide film 3 is removed with a solution of HF, NH$_4$F (ammonium fluoride), or the like.

In dry etching, first oxide film 3 is preferably removed at a temperature not lower than 800° C. and not higher than the temperature of sublimation of SiC and preferably at a temperature not lower than 1000° C. and not higher than the temperature of sublimation of SiC, with the use of a gas including at least one selected from the group consisting of a hydrogen gas, a hydrogen chloride gas, a sulfur fluoride gas, and a carbon fluoride gas. A hydrogen gas, a hydrogen chloride gas, a sulfur fluoride gas, and a carbon fluoride gas at a temperature not lower than 800° C. is highly effective in reducing first oxide film 3. From this point of view, a temperature not lower than 1000° C. is more preferred. In a case where the first oxide film is composed of SiO$_x$, the hydrogen gas decomposes $SiO_x$ into $H_2O$ and $SiH_y$, and the hydrogen chloride gas decomposes $SiO_x$ into $H_2O$ and $SiCl_z$. By setting a temperature not higher than the temperature of sublimation of SiC, deterioration of epitaxial wafer 100 can be suppressed. In addition, from a point of view of promoted reaction, dry etching is preferably carried out under a reduced pressure.

In thermal decomposition, first oxide film 3 is preferably thermally decomposed in an atmosphere not containing oxygen at a temperature not lower than 1200° C. and not higher than the temperature of sublimation of SiC. As first oxide film 3 formed on surface 100a of epitaxial wafer 100 is heated in an atmosphere not containing oxygen not lower than 1200° C., first oxide film 3 can readily be thermally decomposed. By setting a temperature not higher than the temperature of sublimation of SiC, deterioration of epitaxial wafer 100 can be suppressed. In addition, from a point of view of promoted reaction, thermal decomposition is preferably carried out under a reduced pressure.

F plasma refers to plasma generated from gas containing fluorine (F), and it can be generated, for example, by supplying to the plasma generation apparatus, a gas of carbon tetrafluoride ($CF_4$), methane trifluoride ($CHF_3$), chlorofluorocarbons ($C_2F_6$), sulfur hexafluoride ($SF_6$), nitrogen trifluoride ($NF_3$), xenon difluoride ($XeF_2$), fluorine ($F_2$), and chlorine fluoride ($ClF_3$) alone, or a gas mixture thereof. "Removing first oxide film 3 with F plasma" means removal of first oxide film 3 with plasma using a gas containing fluorine. In other words, it means removal of first oxide film 3 by treatment with plasma generated from a gas containing fluorine.

By performing this step S5, first oxide film 3 that has taken in an impurity, particles and the like in step S4 is removed, and therefore the impurity, the particles and the like on surface 100a of epitaxial wafer 100 can be removed. Thus, as shown in FIG. 7, an epitaxial wafer 101 having surface 101a (a second surface) in which an impurity, particles and the like have been decreased can be formed.

In addition, in a case where first oxide film 3 obtained by oxidizing the damaged layer is formed in step S4, the damaged layer can also further be removed by performing step S5. Thus, as shown in FIG. 7, epitaxial wafer 101 having surface 101a in which an impurity, particles and the like have been decreased can be formed. Thus, as shown in FIG. 7, epitaxial wafer 101 having surface 101a in which an impurity, particles and the like have been decreased and from which the damaged layer has been removed can be formed.

It is noted that steps S4 and S5 above may be repeated. Moreover, the step of cleaning with other agents, the step of rinsing with pure water, the drying step, and the like may additionally be performed as necessary. Examples of other agents include SPM containing sulfuric acid and a hydrogen peroxide solution. In a case of cleaning with SPM before step S2, an organic substance can also be removed. In a case where another step is added between step S5 of removing first oxide film 3 and step S6 of forming a gate oxide film 126 which will be described later, the epitaxial wafer is arranged in an atmosphere cut off from the ambient atmosphere even during transition to another step.

Then, referring to FIG. 1, epitaxial wafer 101 from which first oxide film 3 has been removed in removal portion 12 is carried to second forming portion 13. Here, epitaxial wafer 101 is carried through first connection portion 14 having an atmosphere cut off from the ambient atmosphere. In other words, between step S5 of removing first oxide film 3 and step S6 of forming a gate oxide film serving as a second oxide film, epitaxial wafer 101 is arranged in an atmosphere cut off from the ambient atmosphere. Thus, after first oxide film 3 is removed, deposition of an impurity contained in the ambient atmosphere onto surface 101a of epitaxial wafer 101 can be suppressed.

Figure 8:
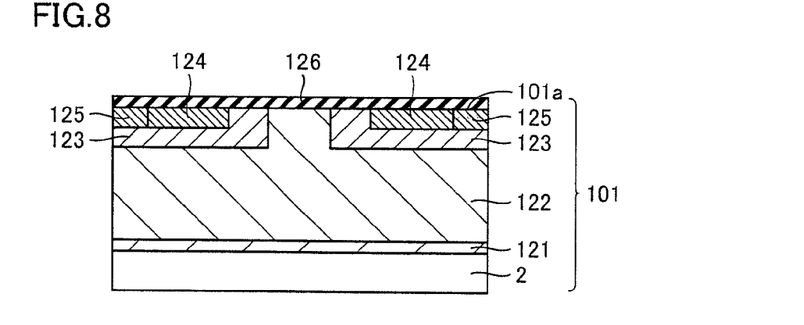
FIG. 8 is a cross-sectional view schematically showing each step of manufacturing an SiC semiconductor device in the first embodiment of the present invention.

Then, as shown in FIGS. 2 and 8, gate oxide film 126 serving as a second oxide film constituting an SiC semiconductor device is formed on surface 101a (the second surface) exposed as a result of removal of first oxide film 3 in epitaxial wafer 101 (step S6). Specifically, as shown in FIG. 8, gate oxide film 126 is formed to cover breakdown voltage holding layer 122, well region 123, source region 124, and contact region 125. The gate oxide film can be formed, for example, by thermal oxidation (dry oxidation). In thermal oxidation, heating to a high temperature in an atmosphere containing oxygen, such as $O_2$, $O_3$, and $N_2O$, is carried out. Conditions for thermal oxidation are, for example, a heating temperature of 1200° C. and a heating time period of 30 minutes. It is noted that formation of gate oxide film 126 is not limited to formation through thermal oxidation, and it may be formed, for example, with CVD, sputtering, or the like. Gate oxide film 126 is implemented, for example, by a silicon oxide film having a thickness of 50 nm.

Between step S5 of removing first oxide film 3 and step S6 of forming gate oxide film 126, a temperature difference in epitaxial wafer 101 having cleaned surface 101a by 500° C. or less is preferably held. In this case, since the temperature difference in the epitaxial wafer between step S5 and step S6 is small, throughput can be improved. Between step S4 of forming first oxide film 3, step S5 of removing first oxide film 3, and step S6 of forming gate oxide film 126, a temperature difference in epitaxial wafer 100, 101 by 500° C. or less is preferably held. In this case, since the temperature difference in the epitaxial wafer is small from start of step S4 until end of step S6, throughput can be improved.

In addition, between step S5 of removing first oxide film 3 and step S6 of forming gate oxide film 126, epitaxial wafer 101 having cleaned surface 101a is preferably held at 800° C. or higher and more preferably at 1000° C. or higher. In this case, since temperature lowering in the epitaxial wafer between step S5 and step S6 can be suppressed, throughput can be improved. Moreover, between step S4 of forming first oxide film 3, step S5 of removing first oxide film 3, and step S6 of forming gate oxide film 126, epitaxial wafer 100, 101 is preferably held at 800° C. or higher and more preferably at 1000° C. or higher. In this case, since temperature lowering in the epitaxial wafer can be suppressed during a period from start of step S4 until end of step S6, throughput can be improved.

Thereafter, nitrogen annealing is performed (step S7). Specifically, annealing treatment in a nitric oxide (NO) atmosphere is performed. For example, conditions in this treatment are such that a heating temperature is set to 1100° C. and a heating time period is set to 120 minutes. Consequently, nitrogen atoms can be introduced in the vicinity of the interface between each of breakdown voltage holding layer 122, well region 123, source region 124, and contact region 125 and gate oxide film 126.

After this annealing step using nitric oxide, annealing treatment using an argon gas which is an inert gas may further be performed. For example, conditions in this treatment are such that a heating temperature is set to 1100° C. and a heating time period is set to 60 minutes.

After this nitrogen annealing step (step S7), surface cleaning such as organic solvent cleaning, acid cleaning, RCA cleaning, or the like may further be performed.

Figure 9:
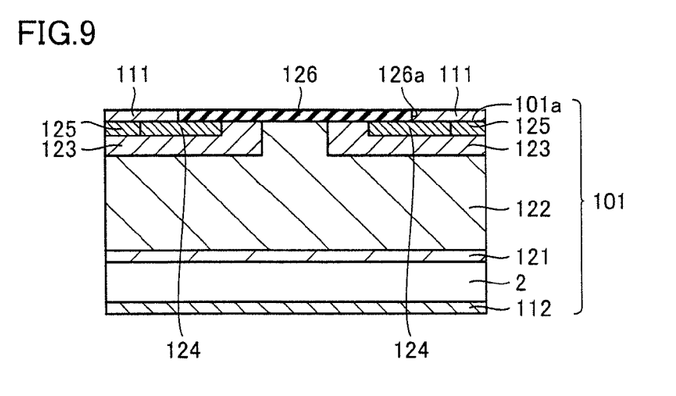
FIG. 9 is a cross-sectional view schematically showing each step of manufacturing an SiC semiconductor device in the first embodiment of the present invention.
Figure 10:
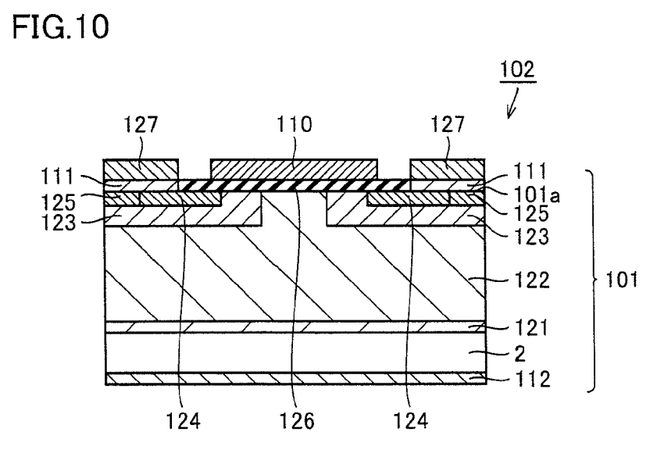
FIG. 10 is a cross-sectional view schematically showing each step of manufacturing an SiC semiconductor device in the first embodiment of the present invention.

Then, as shown in FIGS. 2, 9 and 10, an electrode is formed (step S8). Initially, a source electrode 111 shown in FIG. 9 is formed as follows. Specifically, a resist film having a pattern is formed on gate oxide film 126, using a photolithography method. Using this resist film as a mask, a portion of gate oxide film 126, which is located on source region 124 and contact region 125, is etched away. An opening portion 126a is thus formed in gate oxide film 126. For example, a conductor film is formed in this opening portion 126a in contact with each of source region 124 and contact region 125, for example, with an evaporation method. Then, by removing the resist film, removal (lift-off) of a portion of the conductor film above, that has been located on the resist film, is carried out. This conductor film may be constituted by a metal film and it is composed, for example, of nickel (Ni). As a result of this lift-off, source electrode 111 is formed.

It is noted that heat treatment for alloying is preferably performed here. For example, in an atmosphere of an argon (Ar) gas representing an inert gas, heat treatment for 2 minutes at a heating temperature of 950° C. is performed.

Thereafter, as shown in FIG. 10, an upper source electrode 127 is formed on source electrode 111, for example, with an evaporation method. In addition, a drain electrode 112 is formed on the back surface of SiC substrate 2, for example, with an evaporation method.

Further, a gate electrode 110 is formed, for example, as follows. A resist film having an opening pattern located in a region above gate oxide film 126 is formed in advance and a conductor film constituting a gate electrode is formed to cover the entire surface of the resist film. Then, by removing the resist film, the conductor film other than a portion of the conductor film to serve as the gate electrode is removed (lifted off). Consequently, as shown in FIG. 10, gate electrode 110 can be formed on gate oxide film 126.

By performing the steps (steps S1 to S8) above, a MOSFET 102 representing the SiC semiconductor device shown in FIG. 10 can be manufactured.

It is noted that a configuration in which conductivity types are interchanged in the present embodiment, that is, a configuration in which p-type and n-type are interchanged, can also be employed.

Though SiC substrate 2 is employed for fabricating MOSFET 102, a material for the substrate is not limited to SiC and it may be fabricated with the use of crystal of other materials. Alternatively, SiC substrate 2 may not be provided.

As described above, in the method of manufacturing MOSFET 102 representing one example of the SiC semiconductor device in the present embodiment, epitaxial wafer 101 representing the SiC semiconductor is arranged in an atmosphere cut off from the ambient atmosphere between step S5 of removing first oxide film 3 and step S6 of forming gate oxide film 126 constituting MOSFET 102 serving as the second oxide film.

Apparatus 10 for manufacturing MOSFET 102 representing one example of the SiC semiconductor device in the present embodiment includes first connection portion 14 connecting removal portion 12 and second forming portion 13 to each other so as to be able to carry epitaxial wafer 101, and a region in first connection portion 14 in which epitaxial wafer 101 is carried can be cut off from the ambient atmosphere.

According to the method and the apparatus for manufacturing MOSFET 102 in the present invention, in step S4 of forming a first oxide film, an impurity such as titanium (Ti), particles and the like deposited on surface 100a of epitaxial wafer 100 can be taken into first oxide film 3. Through step S5 of removing first oxide film 3, the impurity, the particles and the like deposited on surface 100a of epitaxial wafer 100 can be removed. By arranging epitaxial wafer 101 having surface 101a from which the impurity, the particles and the like have been removed in an atmosphere cut off from the ambient atmosphere (first connection portion 14), re-deposition of an impurity, particles and the like in the ambient atmosphere onto cleaned surface 101a of epitaxial wafer 101 can be suppressed, and hence surface 101a of epitaxial wafer 101 before formation of gate oxide film 126 can be maintained clean. In step S6 of forming gate oxide film 126, since gate oxide film 126 constituting an SiC semiconductor device can be formed on surface 101a of epitaxial wafer 101 in this state, an impurity, particles and the like present at an interface between epitaxial wafer 101 and gate oxide film 126 can be decreased. In addition, since surface 101a of epitaxial wafer 101 can be maintained clean, an impurity, particles and the like present in gate oxide film 126 formed on surface 101a can also be decreased. Moreover, film quality of gate oxide film 126 can also be improved. Therefore, a breakdown voltage of MOSFET 102 at the time when a reverse voltage is applied can be improved and stability and long-term reliability of an operation at the time when a forward voltage is applied can be improved. Therefore, MOSFET 102 capable of achieving improved characteristics can be manufactured.

In the present embodiment, possibility of re-contamination caused by exposure of epitaxial wafer 101 to the ambient atmosphere after first oxide film 3 is formed on the surface of epitaxial wafer 100 and the surface is cleaned by removing first oxide film 3 is lowered. Since SiC is a stable compound, it is not easy to form first oxide film 3 on surface 100a of epitaxial wafer 100, as compared with Si. Therefore, carrying epitaxial wafer 101 to a next step (step S6 of forming a gate oxide film) without exposing epitaxial wafer 101 to the ambient atmosphere after surface 100a of epitaxial wafer 100 representing the SiC semiconductor is cleaned can simplify cleaning, which greatly contributes to improvement in characteristics of a manufactured SiC semiconductor device.

Further, by arranging epitaxial wafer 101 in first connection portion 14 having an atmosphere cut off from the ambient atmosphere, introduction of such contaminants as particles, an impurity and the like between removal portion 12 for removing first oxide film 3 and second forming portion 13 is less likely. Similarly, possibility of introduction of contamination from between step S5 of removing first oxide film 3 and step S6 of forming gate oxide film 126 can be lowered. Therefore, cleanliness in removal portion 12 and second forming portion 13 can be maintained, which greatly contributes to improvement in characteristics of a manufactured SiC semiconductor device.

In the method of manufacturing MOSFET 102 representing one example of the SiC semiconductor device in the present embodiment, preferably, epitaxial wafer 100, 101 is arranged in an atmosphere cut off from the ambient atmosphere between step S4 of forming first oxide film 3, step S5 of removing first oxide film 3, and step S6 of forming gate oxide film 126.

Apparatus 10 for manufacturing MOSFET 102 representing one example of the SiC semiconductor device in the present embodiment preferably further includes second connection portion 15 connecting first forming portion 11 and removal portion 12 to each other so as to be able to carry epitaxial wafer 100, and a region in second connection portion 15 in which epitaxial wafer 101 is carried can be cut off from the ambient atmosphere.

Thus, exposure of an epitaxial wafer to the ambient atmosphere from start to end of the cleaning step can be suppressed and exposure of epitaxial wafer 101 to the ambient atmosphere from end of the cleaning step until formation of a gate oxide film can be suppressed. Therefore, since re-contamination of surface 100a, 101a of epitaxial wafer 100, 101 during and after cleaning can be suppressed, an SiC semiconductor device capable of achieving further improved characteristics can be manufactured.

Though a method of manufacturing a MOSFET representing an SiC semiconductor device has been described by way of example in the present embodiment, the present invention is applicable to a semiconductor device including an SiC epitaxial wafer having a surface and an oxide film constituting the SiC semiconductor device formed on this surface (an oxide film that remains as the SiC semiconductor device). An SiC epitaxial wafer includes a wafer into which ions have been implanted from the surface and a wafer into which no ion has been implanted. Namely, the present invention is applicable to a semiconductor device having an insulated gate field effect portion, such as a MOSFET or an IGBT (Insulated Gate Bipolar Transistor), and a general SiC semiconductor device including an oxide film such as a JFET (Junction Field-Effect Transistor).

(Second Embodimen)

Figure 11:
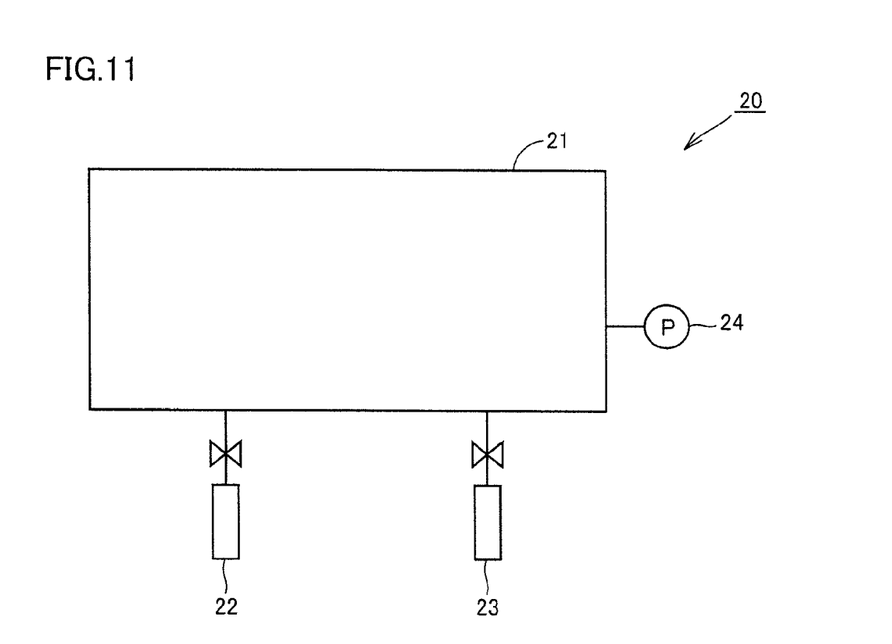
FIG. 11 is a schematic diagram showing an apparatus for manufacturing an SiC semiconductor device in a second embodiment of the present invention.

FIG. 11 is a schematic diagram showing an apparatus for manufacturing an SiC semiconductor device in a second embodiment of the present invention. The apparatus for manufacturing an SiC semiconductor device in the present second embodiment will be described with reference to FIG. 11 and the like.

As shown in FIG. 11, a manufacturing apparatus 20 in the present embodiment includes a chamber 21, a first gas supply portion 22, a second gas supply portion 23, and a vacuum pump 24. First gas supply portion 22, second gas supply portion 23 and vacuum pump 24 are connected to chamber 21.

Chamber 21 accommodates epitaxial wafer 100, 101 (see FIGS. 5 to 7) therein. For example, a plasma generation apparatus can be employed as chamber 21.

First gas supply portion 22 supplies to chamber 21, a gas used for forming first oxide film 3 on epitaxial wafer 100 (see FIG. 6) and forming an oxide film (in the present embodiment, gate oxide film 126) constituting an SiC semiconductor device (in the present embodiment, MOSFET 102) (see FIG. 8). First gas supply portion 22 supplies a gas containing, for example, oxygen.

Second gas supply portion 23 supplies a gas used for removing first oxide film 3 formed on epitaxial wafer 100 to chamber 21. Second gas supply portion 23 supplies a gas for reducing silicon (Si) and oxygen, such as an $H_2$ gas and an HCl gas, to chamber 21.

Vacuum pump 24 produces vacuum in chamber 21. Therefore, after first oxide film 3 is formed on epitaxial wafer 100 by using first gas supply portion 22, vacuum is produced in chamber 21 and then first oxide film 3 can be removed by using second gas supply portion 23. In addition, after first oxide film 3 is removed, vacuum is produced in chamber 21 and a second oxide film (gate oxide film 126) constituting an SiC semiconductor device can be formed on epitaxial wafer 101 by using first gas supply portion 22. It is not necessary to provide vacuum pump 24.

It is noted that manufacturing apparatus 20 shown in FIG. 11 may include various elements other than the above, however, for the sake of convenience of description, these elements are not illustrated and described.

According to the method of manufacturing an SiC semiconductor device in the present embodiment, MOSFET 102 shown in FIG. 9 is manufactured, and this method is basically similar to the method in the first embodiment, however, it is different in use of manufacturing apparatus 20 shown in FIG. 11. Therefore, between step S4 of forming a first oxide film and step S5 of removing the first oxide film and between step S5 of removing the first oxide film and step S6 of forming gate oxide film 126, the epitaxial wafer remains arranged in chamber 21 and hence it is arranged in an atmosphere cut off from the ambient atmosphere.

In addition, gate oxide film 126 serving as the second oxide film can be formed by using the apparatus used in step S5 of removing first oxide film 3. In other words, step S5 of removing first oxide film 3 and step S6 of forming gate oxide film 126 are performed in the same apparatus. Therefore, between step S5 of removing the first oxide film and step S6 of forming a gate oxide film, lowering in temperature of the epitaxial wafer (for example, at 500° C. or lower) can also be avoided and the temperature is maintained as high as possible. Moreover, between step S5 of removing the first oxide film and step S6 of forming a gate oxide film, a temperature of the epitaxial wafer can also be held at 800° C. or higher and preferably at 1000° C. or higher.

Further, in the present embodiment, step S4 of forming first oxide film 3, step S5 of removing first oxide film 3, and step S6 of forming gate oxide film 126 are performed in the same apparatus. Therefore, between step S4 of forming first oxide film 3 and step S5 of removing first oxide film 3 and between step S5 of removing first oxide film 3 and step S6 of forming gate oxide film 126, lowering in temperature of the epitaxial wafer (for example, at 500° C. or lower) can also be avoided and the temperature is maintained as high as possible. Moreover, between step S4 of forming a first oxide film and step S5 of removing the first oxide film and between step S5 of removing the first oxide film and step S6 of forming a gate oxide film, a temperature of the epitaxial wafer can also be held at 800° C. or higher and preferably at 1000° C. or higher.

Further, after step S4 of forming first oxide film 3 has ended and after step S5 of removing first oxide film 3 has ended, vacuum is preferably produced in chamber 21 (for example, vacuuming to 0.1 Pa or lower) by using vacuum pump 24. In other words, at the time of change of a gas between step S4 of forming first oxide film 3 and step S5 of removing first oxide film 3 and at the time of change of a gas between step S5 of removing first oxide film 3 and step S6 of forming gate oxide film 126, a pressure of an atmosphere is preferably reduced (for example, to 0.1 Pa or lower). Thus, since a gas remaining in chamber 21 can be decreased, production of particles caused by vapor phase reaction at the time of introduction of a replacement gas using second or first gas supply portion 23, 22 can be lessened. For example, in a case where first oxide film 3 is composed of $SiO_x$, Si decomposed in step S5 of removing first oxide film 3 is decreased at the time of change between step S5 of removing first oxide film 3 and step S6 of forming gate oxide film 126, so that production of $SiO_2$ particles caused by reaction between remaining Si and an $O_2$ gas introduced for forming gate oxide film 126 can be lessened. Therefore, the surface of the epitaxial wafer can further be cleaned. Namely, production of particles involved with gas change can be suppressed.

From the foregoing, SiC semiconductor manufacturing apparatus 20 in the present embodiment includes chamber 21 for removing first oxide film 3 and forming gate oxide film 126 serving as the second oxide constituting MOSFET 102 representing the SiC semiconductor device on the surface exposed as a result of removal of first oxide film 3 in epitaxial wafer 100. Therefore, by arranging epitaxial wafer 101 from which an impurity, particles and the like have been removed in an atmosphere cut off from the ambient atmosphere (in chamber 21), re-deposition of an impurity, particles and the like in the ambient atmosphere onto surface 101a of epitaxial wafer 101 can be suppressed and hence surface 101 a of epitaxial wafer 101 before formation of gate oxide film 126 can be maintained clean. In step S6 of forming gate oxide film 126, since gate oxide film 126 constituting MOSFET 102 representing the SiC semiconductor device can be formed on surface 101a of epitaxial wafer 101 in this state, an impurity, particles and the like present at an interface between epitaxial wafer 101 and gate oxide film 126 can be decreased. In addition, since surface 101a of epitaxial wafer 101 can be maintained clean, an impurity, particles and the like present in gate oxide film 126 can also be decreased. Moreover, film quality of gate oxide film 126 formed on surface 101a can also be improved. Therefore, a breakdown voltage of MOSFET 102 at the time when a reverse voltage is applied can be improved and stability and long-term reliability of an operation at the time when a forward voltage is applied can be improved. Therefore, MOSFET 102 capable of achieving improved characteristics can be manufactured.

In the present embodiment, manufacturing apparatus 20 in which the first forming portion for forming first oxide film 3 on surface 100a of epitaxial wafer 100 and the second forming portion for removing first oxide film 3 and forming gate oxide film 126 constituting MOSFET 102 on surface 101a exposed as a result of removal of first oxide film 3 in epitaxial wafer 100 are common has been described by way of example. The present invention, however, may be directed to an apparatus in which the first forming portion and the second forming portion are different from each other. Namely, the manufacturing apparatus according to the present invention may have the second forming portion having a structure shown in FIG. 11 and have the first forming portion arranged separately from the second forming portion. In this case, the manufacturing apparatus further includes a connection portion connecting the first forming portion and the second forming portion to each other so as to be able to carry an SiC semiconductor and a region in this connection portion in which the SiC semiconductor is carried can preferably be cut off from the ambient atmosphere.

Though the embodiments of the present invention have been described above, combination of features in each embodiment as appropriate is also originally intended. In addition, it should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

Reference Signs List

2 SiC substrate; 2a, 100a, 101a surface; 3 first oxide film; 10, 20 manufacturing apparatus; 11 first forming portion; 12 removal portion; 13 second forming portion; 14 first connection portion; 15 second connection portion; 21 chamber; 22 first gas supply portion; 23 second gas supply portion; 24 vacuum pump; 100, 101 epitaxial wafer; 102 MOSFET; 110 gate electrode; 111, 127 source electrode; 112 drain electrode; 120 epitaxial layer; 121 buffer layer; 122 breakdown voltage holding layer; 123 well region; 124 source region; 125 contact region; 126 gate oxide film; 126a opening portion; 129 drain region; and 131 p-type SiC layer.

The invention claimed is:

1. A method of manufacturing a silicon carbide semiconductor device, comprising the steps of:
performing an ion implantation into a silicon carbide semiconductor to form a well region and a source region in the well region;
performing an activation annealing treatment to said silicon carbide semiconductor after performing said ion implantation into said silicon carbide semiconductor;
forming a first oxide film which is in contact with said well region and said source region on a first surface of a silicon carbide semiconductor;
removing said first oxide film; and
forming a second oxide film constituting said silicon carbide semiconductor device on a second surface exposed as a result of removal of said first oxide film in said silicon carbide semiconductor, said second oxide film being directly and physically in contact with said well region,
between said step of removing said first oxide film and said step of forming a second oxide film, said silicon carbide semiconductor being arranged in an atmosphere cut off from an ambient atmosphere, and
said step of removing said first oxide film comprising the step of etching using a gas including at least one selected from the group consisting of a hydrogen gas, a hydrogen chloride gas, a sulfur fluoride gas, and a carbon fluoride gas, at a temperature not lower than 800° C. and not higher than a temperature of sublimation of silicon carbide,
in said step of forming a first oxide film, a damaged layer formed by said step of performing said activation annealing treatment and formed on said first surface of said silicon carbide semiconductor is oxidized.

2. The method of manufacturing a silicon carbide semiconductor device according to claim 1, wherein
between said step of forming a first oxide film and said step of removing said first oxide film, said silicon carbide semiconductor is arranged in an atmosphere cut off from the ambient atmosphere.

3. The method of manufacturing a silicon carbide semiconductor device according to claim 1, wherein
said step of removing said first oxide film includes the step of thermally decomposing said first oxide film at a temperature not lower than 1200° C. and not higher than a temperature of sublimation of silicon carbide in an atmosphere not containing oxygen.

4. The method of manufacturing a silicon carbide semiconductor device according to claim 1, wherein
between said step of removing said first oxide film and said step of forming a second oxide film, a temperature difference in said silicon carbide semiconductor by 500° C. or less is held.

5. The method of manufacturing a silicon carbide semiconductor device according to claim 4, wherein
in said step of forming a second oxide film, said second oxide film is formed by using an apparatus used in said step of removing said first oxide film.

6. The method of manufacturing a silicon carbide semiconductor device according to claim 2, wherein
between the steps of forming a first oxide film, removing said first oxide film, and forming a second oxide film, a temperature difference in said silicon carbide semiconductor by 500° C. or less is held.

7. The method of manufacturing a silicon carbide semiconductor device according to claim 6, wherein
an apparatus used in said step of forming a first oxide film, an apparatus used in said step of removing said first oxide film, and an apparatus used in said step of forming a second oxide film are common.

8. The method of manufacturing a silicon carbide semiconductor device according to claim 1, wherein said second oxide film is a gate insulation film.

9. The method of manufacturing a silicon carbide semiconductor device according to claim 1, wherein said second oxide film is formed on said second surface exposed as a result of removal of said first oxide film without performing an ion implantation.

10. The method of manufacturing a silicon carbide semiconductor device according to claim 1, wherein said second oxide film is formed on directly said second surface exposed as a result of removal of said first oxide film.

11. The method of manufacturing a silicon carbide semiconductor device according to claim 1, wherein said well region and said source region have different impurity types.

* * * * *